(12) United States Patent
Ji et al.

(10) Patent No.: US 9,209,326 B2
(45) Date of Patent: Dec. 8, 2015

(54) SOLAR CELL HAVING MULTIPLE TRANSPARENT CONDUCTIVE LAYERS AND MANUFACTURING METHOD THEREOF

(75) Inventors: Kwang Sun Ji, Seoul (KR); Young Joo Eo, Seoul (KR); Heon Min Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 305 days.

(21) Appl. No.: 12/365,463

(22) Filed: Feb. 4, 2009

(65) Prior Publication Data

US 2009/0194161 A1 Aug. 6, 2009

(30) Foreign Application Priority Data

Feb. 4, 2008 (KR) .................. 10-2008-0011157

(51) Int. Cl.
  *H01L 31/00* (2006.01)
  *H01L 31/0224* (2006.01)
  *H01L 31/0236* (2006.01)
  *H01L 31/18* (2006.01)

(52) U.S. Cl.
  CPC .. *H01L 31/022483* (2013.01); *H01L 31/02366* (2013.01); *H01L 31/022466* (2013.01); *H01L 31/1884* (2013.01); *Y02E 10/50* (2013.01); *Y02E 10/52* (2013.01)

(58) Field of Classification Search
  CPC ............... H01L 31/022466; H01L 31/1884; H01L 31/022483; H01L 31/02366; Y02E 10/52; Y02E 10/50
  USPC ......................................... 136/252, 256, 265
  See application file for complete search history.

(56) References Cited

U.S. PATENT DOCUMENTS

| | | | | |
|---|---|---|---|---|
| 4,497,974 A | * | 2/1985 | Deckman et al. | 136/259 |
| 6,602,606 B1 | * | 8/2003 | Fujisawa et al. | 428/432 |
| 2003/0175557 A1 | * | 9/2003 | Anderson et al. | 428/698 |
| 2006/0065299 A1 | * | 3/2006 | Fukawa et al. | 136/256 |
| 2008/0047603 A1 | * | 2/2008 | Krasnov | 136/256 |

FOREIGN PATENT DOCUMENTS

| | | | |
|---|---|---|---|
| EP | 987774 A2 | * | 3/2000 |
| JP | 01-205474 | | 8/1989 |
| JP | 05-232488 | | 9/1993 |
| JP | 09-139515 | | 5/1997 |
| JP | 2001-039738 | | 2/2001 |

(Continued)

OTHER PUBLICATIONS

English machine translation of JP 2004-214442A.*
Smestad, Greg. "Optoelectronics of Solar Cells". The international society for optical engineering. 2002. Sections 2.2.2 and 2.2.3.*
Korean Office Action dated Jun. 24, 2010 issued in Application No. 10-2008-0011157.
Japanese Office Action dated May 7, 2013.
European Search Report dated May 23, 2013.

(Continued)

*Primary Examiner* — Jonathan Johnson
*Assistant Examiner* — Lindsey Bernier
(74) *Attorney, Agent, or Firm* — Ked & Associates LLP

(57) ABSTRACT

A solar cell is provided that increases a rate of sunlight absorbed into a photoelectric conversion layer by forming a transparent conductive layer into a plurality of layers having different oxygen contents and different light absorption coefficients, and a manufacturing method thereof. The solar cell includes a substrate, a transparent conductive layer, and a photoelectric conversion layer. The transparent conductive layer includes a first layer having a first light absorption coefficient, and a second layer formed on the first layer and having a second light absorption coefficient higher than the first light absorption coefficient.

9 Claims, 6 Drawing Sheets

(56) References Cited

FOREIGN PATENT DOCUMENTS

| | | |
|---|---|---|
| JP | 2002-208715 | 7/2002 |
| JP | 2004214442 A * | 7/2004 |
| JP | 2007-234866 | 9/2007 |
| JP | 2007-273455 | 10/2007 |
| WO | 2007/058118 A1 | 5/2007 |

OTHER PUBLICATIONS

James R. Shealy et al.; "Preparation and Properties of Zinc Oxide Films Grown by the Oxidation of Diethylzinc", Journal of Electrochemical Society, vol. 128, No. 3, Mar. 1981, pp. 558-561, XP001309036.

Japanese Office Action dated Jul. 3, 2012.

* cited by examiner

ETCHING FOR 90 SECONDS

ETCHING FOR 120 SECONDS

RELATED ART          PRESENT INVENTION

US 9,209,326 B2

SOLAR CELL HAVING MULTIPLE TRANSPARENT CONDUCTIVE LAYERS AND MANUFACTURING METHOD THEREOF

TECHNICAL FIELD

The present invention relates to a solar cell having multiple transparent conductive layers and a manufacturing method thereof. More specifically, the present invention relates to a solar cell that increases a rate of sunlight absorbed into a photoelectric conversion layer by forming a transparent conductive layer into a plurality of layers having different oxygen contents and different light absorbing coefficients and a manufacturing method thereof.

BACKGROUND ART

Recently, due to problems such as a rapid rise in oil prices, an environmental problem of the earth, exhaustion of fossil energy, waste treatment in nuclear power generation, position selection according to construction of a new power plant, etc., interest in renewable energy has increased and among others, research and development for a solar cell, which is a pollution-free energy source, has actively been progressed.

The solar cell, which is a device converting light energy into electrical energy using a photovoltaic effect, has recently been receiving much attention according to an increased demand of alternative energy.

In the solar cell, it is important to increase conversion efficiency that is associated with a rate of converting incident sunlight into electric energy. Various researches to increase the conversion efficiency have been progressed and research to increase a rate of sunlight absorbed into the solar cell by reducing light loss as much as possible so as to increase the efficiency of the solar cell has been progressed.

DISCLOSURE

Technical Problem

An object of the present invention is to provide a solar cell that can increase efficiency by increasing transmittance of sunlight by forming a transparent conductive layer of the solar cell in a multi-layer structure including a plurality of layers having different oxygen contents and different light absorbing coefficients and a manufacturing method thereof.

Another object of the present invention is to provide a solar cell that can increase efficiency by forming a transparent conductive layer of the solar cell in a multi-layer structure including a plurality of layers having different refractive indexes so that incident sunlight is absorbed again into a photoelectric conversion layer even when the incident sunlight passes through the photoelectric conversion layer, is reflected from a rear electrode, and again reaches the transparent conductive layer and a manufacturing method thereof.

Still another object of the present invention is to provide a solar cell that includes a transparent conductive layer having excellent crystallinity and large crystal grain size on the whole by configuring the transparent conductive layer of the solar cell in a structure that includes a first layer having high oxygen content and a second layer deposited on the first layer so that the excellent crystallinity and large crystal grain size of a first layer can be maintained even in the second layer and a manufacturing method thereof.

Technical Solution

To achieve the above objects, the present invention provides a solar cell including a substrate, a transparent conductive layer, and a photoelectric conversion layer, the transparent conductive layer comprising: a first layer having a first light absorbing coefficient; and a second layer that is formed on the first layer and has a second light absorbing coefficient higher than the first light absorbing coefficient. Each transparent conductive layer may be configured of one layer or a plurality of layers.

In the present invention, the oxygen content of the first layer may be relatively higher than the oxygen content of the second layer.

In the present invention, the oxygen contents of the first and second layers may be reduced as the first and second layers become further away from the substrate.

In the present invention, crystallinity of the first layer may be relatively higher than that of the second layer. The crystallinity of the first and second layers of the transparent conductive layer of the present invention may be defined by a concept that includes a crystallized degree of a material forming the layers, that is, a volume ratio occupied by a crystal grain size per a unit volume and a concept that includes a crystal grain size of these layers.

In the present invention, the refractive indexes of the first and second layers may be different from each other.

In the present invention, the optical bandgap energy of the first layer may be relatively lower than that of the second layer.

In the present invention, the specific resistance of the first layer may be relatively higher than that of the second layer.

In the present invention, the transparent conductive layer may include any one selected from a group consisting of zinc oxide (ZnO)-based material, tin oxide ($SnO_2$), and indium tin oxide (ITO) ($In_2O_3$:$SnO_2$) or may be doped with at least one selected from a group consisting of aluminum (Al), gallium (Ga), fluorine (F), germanium (Ge), magnesium (Mg), boron (B), indium (In), tin (Sn), and lithium (Li).

The solar cell of the present invention may be configured to include, as an intermediate layer, a layer having intermediate properties of the above-mentioned properties between the transparent conductive layers configured of the first and second layers of the above-mentioned multiple layers.

The first layer of the transparent conductive layer of the present invention may be called a transmitting layer since it has relatively excellent light transmittance and the second layer of the transparent conductive layer may be called a conductive layer since it may have light transmittance smaller than the first layer but has significantly reduced specific resistance and may be used as a conductive layer that may move carriers generated from the photoelectric conversion layer due to low contact resistance with the photoelectric conversion layer deposited later.

To achieve the above object, the present invention provides a solar cell including a substrate, a transparent conductive layer, a photoelectric conversion layer, wherein the transparent conductive layer has a higher light absorbing coefficient at a surface adjacent to the photoelectric conversion layer than that at a surface to which light is incident.

In the present invention, oxygen concentration at the surface to which light is incident may be higher than oxygen concentration at the surface adjacent to the photoelectric conversion layer.

In the present invention, the transparent conductive layer may reduce the oxygen concentration at the same layer.

To achieve the above objects, the present invention provides a manufacturing method of a solar cell including a substrate, a transparent conductive layer, and a photoelectric conversion, the manufacturing method comprising: depositing the transparent conductive layer having reduced oxygen content on the substrate as it becomes further away from the substrate.

In the manufacturing method of the present invention, the transparent conductive layer may be deposited while gradually reducing the volume fraction of oxygen among gases introduced at the time of deposition.

To achieve the above objects, the present invention provides a manufacturing method of a solar cell including a substrate, a transparent conductive layer, and a photoelectric conversion, the manufacturing method comprising: depositing a first layer on the substrate under a gas atmosphere including oxygen to prepare the transparent conductive layer; and depositing a second layer on the first layer under a gas atmosphere including oxygen having lower concentration than that of oxygen used in the first layer deposition step.

In the manufacturing method of the present invention, the transparent conductive layer may include any one selected from a group consisting of zinc oxide (ZnO)-based material, tin oxide ($SnO_2$), and indium tin oxide (ITO) ($In_2O_3$:$SnO_2$) or may be doped with at least one selected from a group consisting of aluminum (Al), gallium (Ga), fluorine (F), germanium (Ge), magnesium (Mg), boron (B), indium (In), tin (Sn), and lithium (Li).

Advantageous Effects

According to the present invention, the efficiency of the solar cell can be increased by increasing transmittance of sunlight by forming a transparent conductive layer of the solar cell in a multi-layer structure including a plurality of layers having different oxygen contents and different light absorbing coefficients.

Further, the efficiency of the solar cell can be increased by forming a transparent conductive layer of the solar cell in a multi-layer structure including a plurality of layers having different refractive indexes so that incident sunlight is absorbed again into a photoelectric conversion layer even when the incident sunlight passes through the photoelectric conversion layer, is reflected from a rear electrode, and again reaches the transparent conductive layer.

Also, the solar cell that includes a transparent conductive layer having the excellent crystallinity and large crystal grain size on the whole by configuring the transparent conductive layer of the solar cell in a structure that includes a first layer having high oxygen content and a second layer deposited on the first layer so that the excellent crystallinity and large crystal grain size of a first layer can be maintained even in the second layer.

DESCRIPTION OF DRAWINGS

The above and other objects, features and advantages of the present invention will become apparent from the following description of preferred embodiments given in conjunction with the accompanying drawings, in which.

BEST MODE

Hereinafter, exemplary embodiments of the present invention will be described in detail with reference to the accompanying drawings.

Figure 1:
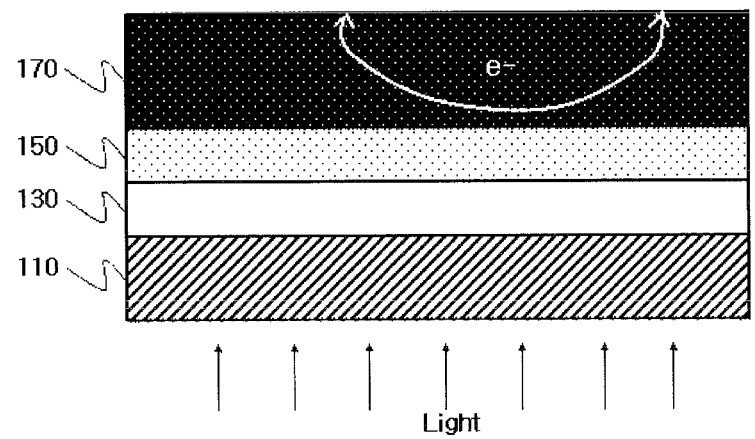
FIG. 1 is a cross-sectional view schematically showing a configuration of a transparent conductive layer according to one embodiment of the present invention.

FIG. 1 is a cross-sectional view schematically showing a configuration of a transparent conductive layer according to one embodiment of the present invention.

As shown in FIG. 1, a transparent conductive layer 100 applied to a solar cell of the present invention includes a transmitting layer 130, an intermediate layer 150, and a conductive layer 170 that are sequentially deposited on a glass substrate 110.

Figure 2:
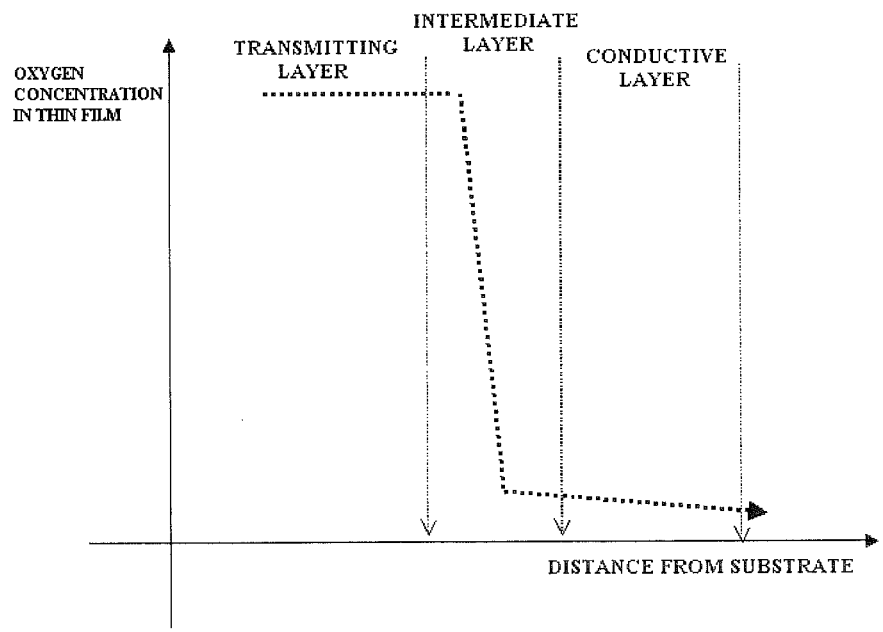
FIG. 2 is a graph showing an amount of oxygen contained in each layer included in the transparent conductive layer of FIG. 1.

The transmitting layer 130, the intermediate layer 150, and the conductive layer 170 are divided according to an amount of oxygen contained in each layer. That is, each layer consists of the same materials, while the amount of the oxygen of the layers is different from each other. Referring to FIG. 2 that shows oxygen contents of each layer, the transmitting layer 130 is a layer containing a largest amount of oxygen, the conductive layer 170 is a layer containing a smallest amount of oxygen, and the intermediate layer 150, which is a layer deposited while the amount of oxygen is reduced after the deposition of the transmitting layer 130, is a boundary layer between the transmitting layer 130 and the conductive layer 170.

Meanwhile, as composition materials of the transmitting layer 130, the intermediate layer 150, and the conductive layer 170, zinc oxide (ZnO)-based materials can be basically used but tin oxide ($SnO_2$) and indium tin oxide (ITO) ($In_2O_3$:$SnO_2$), etc., can be used, wherein the basic material can be doped with aluminum (Al), gallium (Ga), fluorine (F), germanium (Ge), magnesium (Mg), boron (B), indium (In), tin (Sn), lithium (Li), and the like. Among others, it is preferable to use the zinc oxide having high haze ratio. Herein, the haze ratio is a value defined by (diffusion transmittance)/(straight transmittance)×100%. The haze ratio is represented by the following equation 1.

$$\text{Haze}_T(\%) = \frac{T_D}{T_S} \times 100 = \frac{T_T - T_S}{T_S} \times 100 \quad (1)$$

Wherein, $T_D$ represents diffusion transmittance, $T_S$ represents straight transmittance, and $T_T$ represents total transmittance.

The high haze ratio means that most of incident sunlight can be absorbed into a photoelectric conversion layer by allowing light diffused or transmitted among sunlight incident through the glass substrate 110 to occupy high ratio.

As described above, the transmitting layer 130 is a layer containing a relatively large amount of oxygen. The light transmittance can be relatively higher by the property of a large content of oxygen. Therefore, the transmitting layer 130 can perform a role of reducing loss of sunlight incident through the glass substrate 110. On the other hand, since the transmitting layer 130 contains a large amount of oxygen, crystallinity is excellent and a crystal grain size also increases.

The conductive layer 170, which includes a layer containing a much smaller amount of oxygen than the transmitting layer 130, is a layer deposited while the amount of oxygen is reduced in the deposition process. According to this property, as the conductive layer 170 has a relatively higher light absorbing coefficient than the transmitting layer 130, the optical bandgap energy Eg becomes higher.

Meanwhile, when the conductive layer 170 is deposited, the transmitting layer 130 serves as a seeding layer and the property of the transmitting layer 130 having high oxygen content advantageously serves to grow the conductive layer 170.

Since the conductive layer 170 has low oxygen content, light transmittance can be relatively low, but specific resistance is significantly reduced. Due to the low specific resistance, the contact resistance with the photoelectric conversion layer deposited later is low, such that carriers generated by light absorption in the photoelectric conversion layer can be moved in the conductive layer 170.

On the other hand, the intermediate layer 150, which is a layer deposited while the amount of oxygen is reduced in the sequential deposition processes of the transmitting layer 130 and the conductive layer 170, serves to maintain the crystallinity of the transmitting layer 130 up to the conductive layer 170.

Table 1 indicates a difference between absorption coefficients of each of the transmitting layer 130 and the conductive layer 170 about main absorption wavelength bands of the solar cell.

TABLE 1

| Wavelength (nm) | Absorption coefficient | | Difference (%) |
|---|---|---|---|
| | Conductive layer | Transmitting layer | |
| 550 | $2.99 \times 10^3$ | $2.66 \times 10^3$ | 11.23 |
| 1000 | $8.64 \times 10^2$ | $8.49 \times 10^2$ | 1.69 |
| 400 to 1000 | $2.31 \times 10^3$ | $2.10 \times 10^3$ | 9.17 |

It can be appreciated from Table 1 that there is a difference in absorption coefficients of about 9% in average in a wavelength band of 400 nm to 1000 nm. Therefore, in the case of the present invention using a film having a relatively small absorption coefficient as the transmitting layer 130, it can contribute to improving the efficiency of the solar cell.

Figure 3:
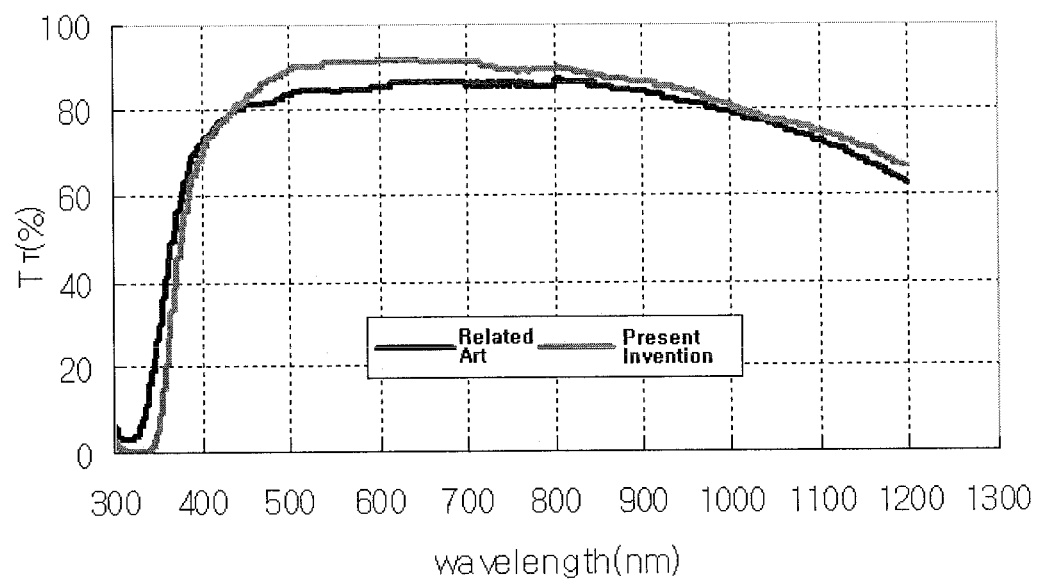
FIGS. 3 and 4 are graphs showing transmittance of the transparent conductive layer whose surface is textured according to one embodiment of the present invention.
Figure 4:
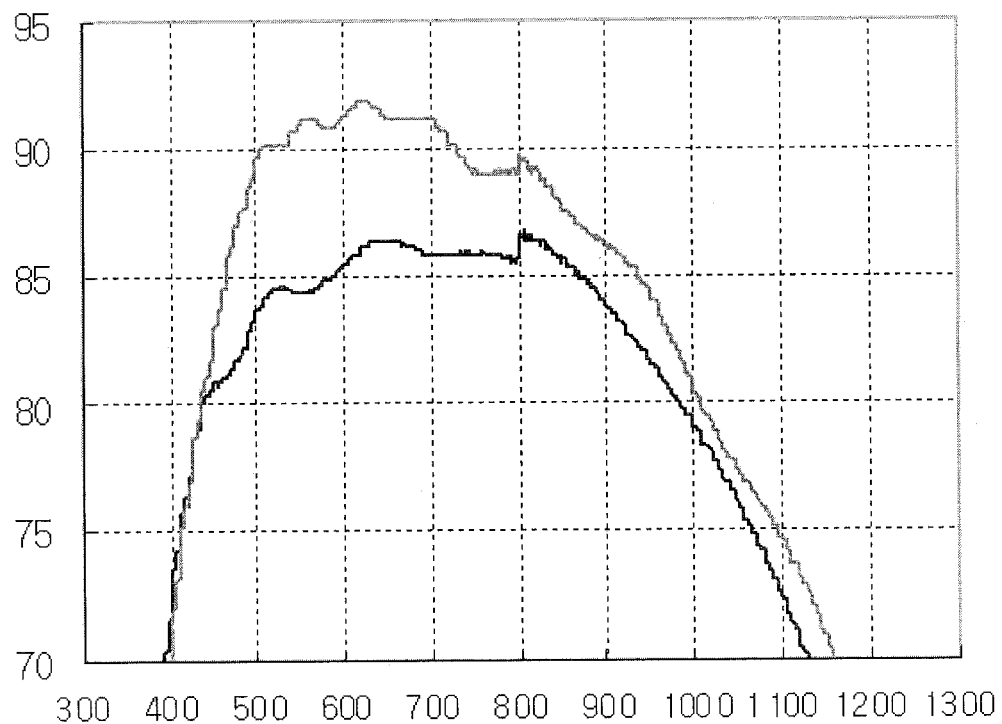

Meanwhile, FIGS. 3 and 4 are graphs showing the transmittance of the surface-textured transparent conductive layer 100.

As shown in FIGS. 3 and 4, it can be appreciated that the transparent layer 100 of the present invention improves total transmittance $T_T$ in the wavelength band of 400 nm to 1200 nm as compared to the related art.

Figure 5:
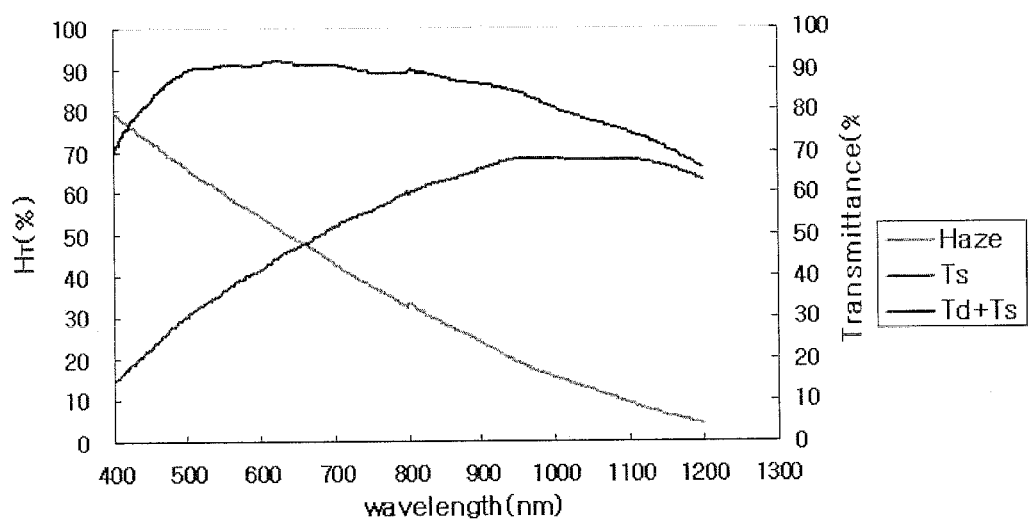
FIG. 5 a graph showing a haze ratio of the transparent conductive layer according to one embodiment of the present invention.

Meanwhile, FIG. 5 is a graph showing a haze ratio of the transparent conductive layer 100 of the present invention.

As shown in FIG. 5, the transparent conductive layer 100 of the present invention has the haze ratio of about 60% in the wavelength region of about 550 nm and has the haze ratio of 40% or more in average, such that it is suitable for applying to the transparent conductive layer.

The improved effect of the efficiency of the solar cell provided with the transparent conductive layer 100 according to the present invention can be apparently appreciated from the optical property simulation results using the following equation 2.

$$R(\%) = \frac{(n_s - n_c^2)^2}{(n_s + n_c^2)^2} \times 100 \qquad (2)$$

Wherein, R represents reflectance, $n_s$ represents refractive index of the skin, and $n_c$ represents refractive index of the coating.

Figure 7:
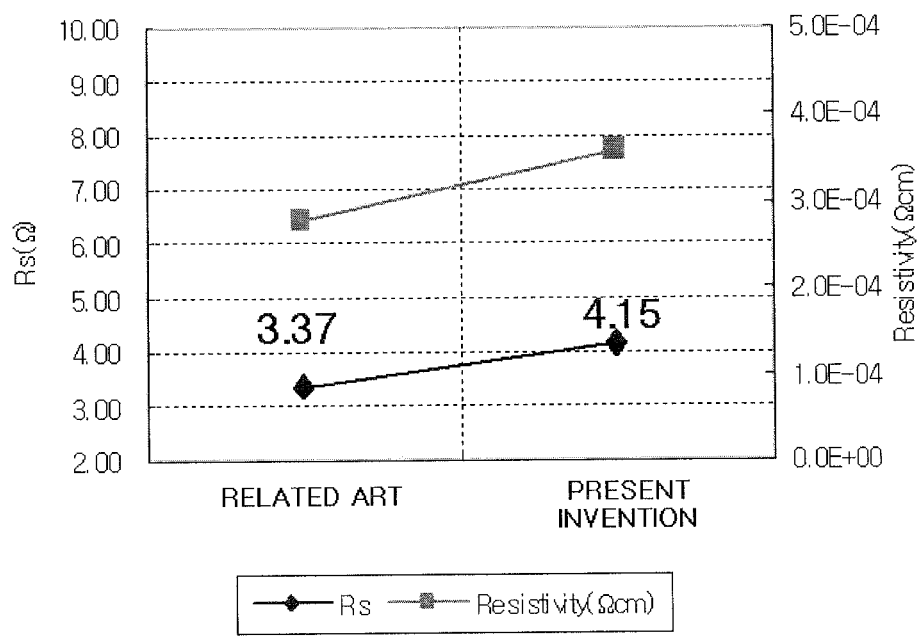
FIGS. 7 and 8 are graphs showing electrical properties of the transparent conductive layer according to one embodiment of the present invention.

This optical property simulation is performed under the assumption that light having the wavelength of about 550 nm in a superstrate solar cell is vertically incident. The refractive indexes of each material used for the optical property simulation are shown in Table 2 and the optical properties of the solar cell to which the transparent conductive layer 100 of the present invention simulated by using equation 2 and data shown in table 2 is applied is shown in FIG. 7.

TABLE 2

| Layer | Refractive Index |
|---|---|
| i-Si | 4.50 |
| p-Si | 3.10 |
| Conductive layer 170 of transparent conductive layer 100 | 1.89 |
| Transmitting layer 130 of transparent conductive layer 100 | 2.05 |
| Glass substrate of soda lime | 1.50 |
| Air | 1.00 |

Figure 6:
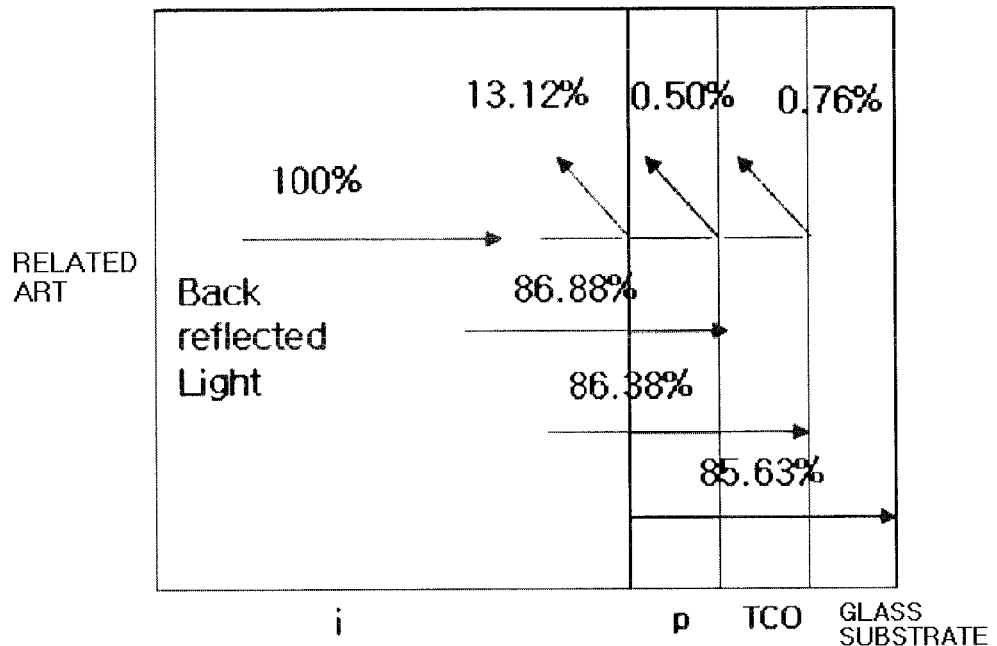
FIG. 6 is a diagram showing optical properties of a solar cell to which the transparent conductive layer according to one embodiment of the present invention is applied.
Figure 6:
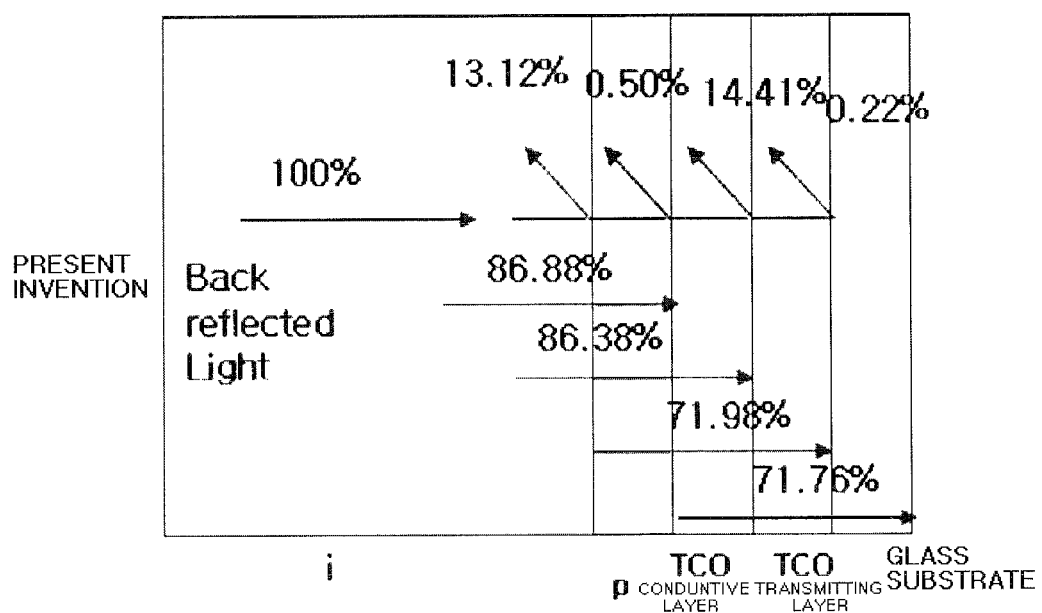

FIG. 6 is a diagram showing optical properties in the case where light incident through the glass substrate 110 passes through the photoelectric conversion layer, is reflected from a rear electrode made of metal or metal oxide, and is returned back to the glass substrate 110.

As shown in FIG. 6, in the solar cell using the transparent conductive layer in the related art, when the incident light passes through the photoelectric conversion layer, is reflected from the rear electrode, and is returned back, 85% of the incident light reaches the glass substrate, but in the case of the solar cell using the transparent conductive layer of the present invention, since each of the conductive layer 170 and the transmitting layer 130 has different refractive indexes, light is reflected back to the photoelectric layer so that only about 71% of light reaches the glass substrate.

In other words, when the solar cell using the transparent conductive layer 100 of the present invention reflects light incident through the glass substrate 110 from the rear electrode such that it is returned back, about 14% of light is reflected back to the photoelectric conversion layer, such that the efficiency of the solar cell can be improved by the re-absorption of light.

Figure 8:
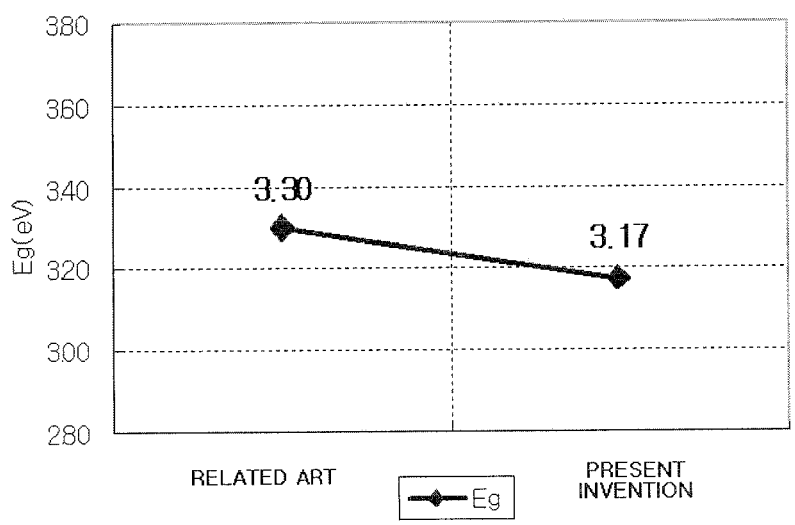

Meanwhile, FIGS. 7 and 8 are graphs showing electrical properties of the transparent conductive layer 100 according to the present invention.

As shown in FIG. 7, the transparent conductive layer 100 shows a value of 10Ω or less that is a generally required surface resistance (Rs) value of the transparent conductive layer and a value of $5\times10^{-4}$ or less that is a generally required specific resistance value of the transparent conductive layer, such that it can be applied to the solar cell.

Further, as shown in FIG. 8, the optical band gap energy Eg is slightly lowered by the addition of oxygen, but shows a value of 3.0 eV that is a generally required Eg value, such that these properties can be also applied to the solar cell.

Figure 9:
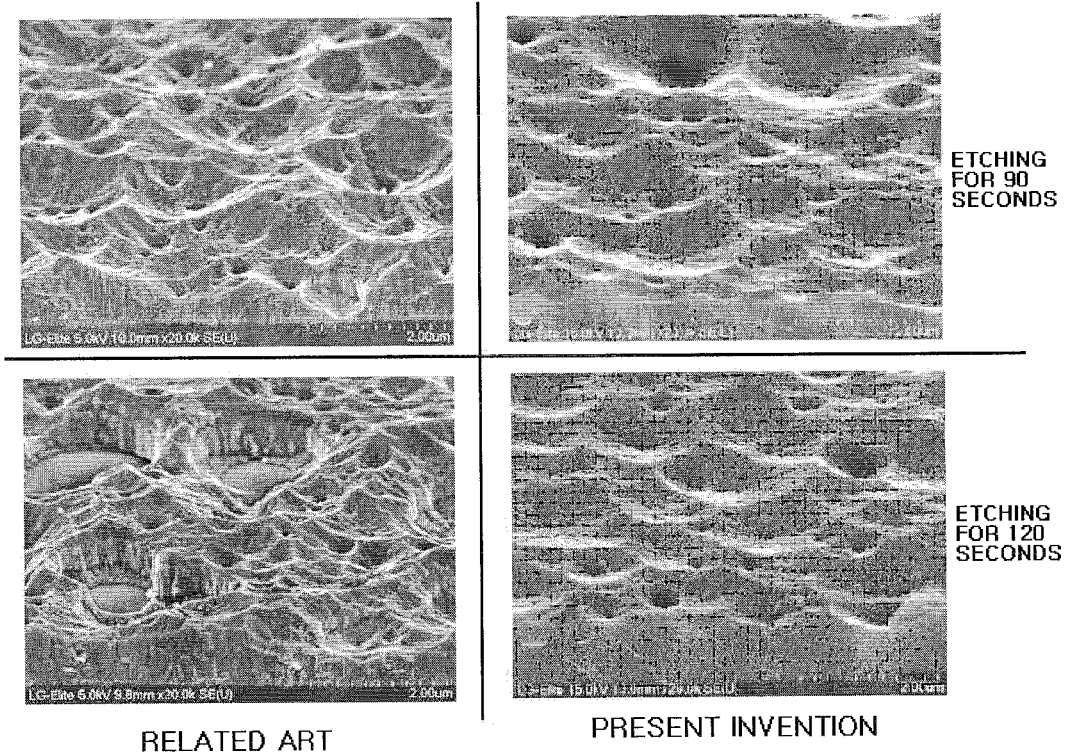
FIG. 9 is an image showing surface shapes of the transparent conductive layer according to one embodiment of the present invention.

Meanwhile, FIG. 9 is an image showing surface shapes of the transparent conductive layer 100 according to one embodiment of the present invention. As shown in FIG. 9, when comparing with the transparent conductive layer in the related art, it can be appreciated that the transparent conductive layer is uniform by significantly reducing a crater having an irregularly small size.

Further, when performing an etching on the transparent conductive layer 100 in order to form the surface texturing structure, when comparing with the etching on the transparent conductive layer in the related art, it can be observed that the damage of the transparent conductive layer is small and a fine crease is formed on the surface. This shows that as described above, the high oxygen content, the excellent crystallinity, and the large crystal grain size, which are maintained in the transmitting layer 130, are also maintained in the conductive layer 170.

Hereinafter, a manufacturing method of the transparent conductive layer 100 according to the present invention will be described.

First, under the oxygen atmosphere, materials to be used as the transparent conductive layer are deposited on the glass substrate 110. As described above, the materials can use zinc oxide (ZnO)-based materials as the basic materials. The deposition can be performed by a sputtering, a chemical vapor deposition, etc., which are known deposition methods. The above materials deposited on the glass substrate 110 under atmosphere having a high initial oxygen ratio can function as the transmitting layer 130

Thereafter, if the materials for the transparent conductive layer are continuously deposited on the glass substrate 110, the amount of peripheral oxygen is reduced, such that the layer having a small oxygen content is deposited on the top. By these processes, the conductive layer 170 can be formed. When depositing the conductive layer, the transmitting layer 130 can serve as the seed layer 170.

Figure 10:
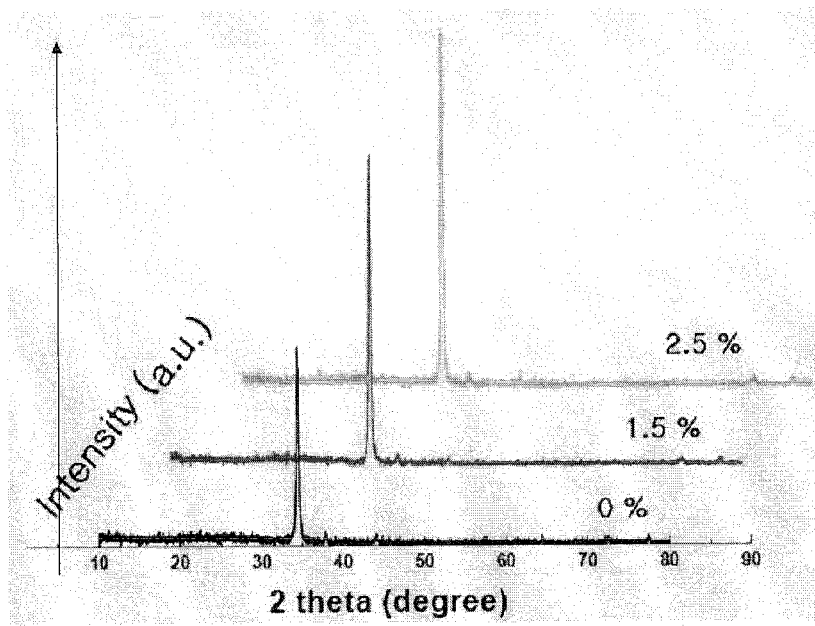
FIG. 10 is a graph showing an improved crystallinity of the transparent conductive layer when oxygen is added at the time of depositing the transparent conductive layer according to one embodiment of the present invention.

FIG. 10 is a graph showing the crystallinity improvement of the transparent conductive layer when oxygen is added at the time of deposition. Referring to FIG. 10, the higher the volume fraction occupied by oxygen among gases introduced at the time of deposition, the more the crystallinity increases, such that the transmitting layer 130 deposited under the atmosphere showing the high oxygen ratio shows the excellent crystallinity properties. This transmitting layer 130 advantageously serves to grow the conductive layer 170, such that the properties, such as the excellent crystallinity and the large crystal grain, etc., are transferred up to the conductive layer 170.

Meanwhile, the transmitting layer 130 and the conductive layer 170 can be sequentially formed by naturally lowering the oxygen fraction by continuously performing the deposition under the oxygen atmosphere as described above. However, the transmitting layer 130 can be deposited under the atmosphere having a high oxygen fraction and then, the conductive layer 170 can be deposited under the atmosphere having a low oxygen fraction.

As one embodiment of the structure of the solar cell including the transparent conductive layer according to the present invention, there may be a solar cell (not shown) wherein a glass substrate, a transparent conductive layer of the present invention as a lower transparent conductive layer, an amorphous silicon solar cell layer (a-si:H p/i/n layers) as a photoelectric conversion layer, a transparent conductive layer of the present invention as a lower transparent conductive layer, and a rear electrode are sequentially formed. The solar cell including the transparent conductive layer of the present invention can be manufactured the methods well known to those skilled in the art and therefore, the detailed description of the manufacturing method will not be repeated.

The amorphous silicon type solar cell using the transparent electrode of the present invention is described, but the transparent electrode can be applied to the solar cell having the photoelectric conversion layer by changing factors such as compounds, dye sensitivity, organic materials, etc.

Although the present invention has been described in detail with reference to its presently preferred embodiment, it will be understood by those skilled in the art that various modifications and equivalents can be made without departing from the spirit and scope of the present invention, as set forth in the appended claims. Also, the substances of each constituent explained in the specification can be easily selected and processed by those skilled in the art from the well-known various substances. Also, those skilled in the art can remove a part of the constituents as described in the specification without deterioration of performance or can add constituents for improving the performance. Furthermore, those skilled in the art can change the order to methodic steps explained in the specification according to environments of processes or equipments. Thus, it is intended that the present invention covers the modifications and variations of this invention provided they come within the scope of the appended claims and their equivalents.

The invention claimed is:

1. A solar cell including a substrate, a transparent conductive layer with a multilayer structure formed on the substrate, a photoelectric conversion layer, and a rear electrode, the transparent conductive layer comprising:
   a first layer formed on the substrate and having a first light absorption coefficient and a first refractive index; and
   a second layer formed on the first layer and having a second light absorption coefficient higher than the first light absorption coefficient and a second refractive index lower than the first refractive index, wherein an incident light passes through the photoelectric conversion layer and is reflected from the rear electrode, wherein the first layer reflects the reflected light back to the second layer, and wherein the second layer reabsorbs the reflected light, wherein the first layer is disposed closer to the substrate than the second layer, and the second layer is disposed closer to the photoelectric conversion layer than the first layer, wherein the transparent conductive layer includes a zinc oxide (ZnO)-based material as a basic material;
   wherein an oxygen content of the first layer is higher than an oxygen content of the second layer and wherein oxygen contents of the first and second layers are reduced as the first and second layers extend away from the substrate.

2. The solar cell according to claim 1, wherein a crystallinity of the first layer is higher than a crystallinity of the second layer.

3. The solar cell according to claim 1, wherein a specific resistance of the first layer is higher than a specific resistance of the second layer.

4. The solar cell according to claim 1, wherein the transparent conductive layer further includes any one selected from a group consisting of tin oxide ($SnO_2$), and indium tin oxide (ITO) ($In_2O_3:SnO_2$) or is doped with at least one selected from a group consisting of aluminum (Al), gallium (Ga), fluorine (F), germanium (Ge), magnesium (Mg), boron (B), indium (In), tin (Sn), and lithium (Li).

5. A solar cell, comprising:
a substrate;
a transparent conductive layer;
a photoelectric conversion layer; and
a rear electrode, wherein the transparent conductive layer has a higher light absorption coefficient at a surface adjacent to the photoelectric conversion layer than a light absorption coefficient at a surface to which light is incident, wherein a portion of the transparent conductive layer having the lower light absorption coefficient reflects the light back to a portion of the transparent conductive layer having the higher light absorption coefficient and the photoelectric conversion layer, wherein the photoelectric conversion layer reabsorbs the light reflected by the portion of the transparent conductive layer having the lower light absorption coefficient, wherein the portion of the transparent conductive layer having the lower light absorption coefficient is disposed closer to the substrate than the portion of the transparent conductive layer having the higher light absorption coefficient, and the portion of the transparent conductive layer having the higher light absorption coefficient is disposed closer to the photoelectric conversion layer than the portion of the transparent conductive layer having the lower light absorption coefficient, wherein the transparent conductive layer includes a zinc oxide (ZnO)-based material as a basic material;
wherein an oxygen concentration at the surface of the transparent conductive layer to which light is incident is higher than an oxygen concentration at the surface of the transparent conductive layer adjacent to the photoelectric conversion layer; and
wherein an oxygen concentration varies in the transparent conductive layer, and wherein the oxygen concentration decreases gradually from a surface of the transparent conductive layer adjacent to the substrate to a surface of the transparent conductive layer adjacent to the photoelectric conversion layer.

6. A solar cell including a substrate, a transparent conductive layer with a multilayer structure formed on the substrate, a photoelectric conversion layer, and a rear electrode, the transparent conductive layer comprising:
a first layer formed on the substrate; and
a second layer formed on the first layer, wherein an oxygen content of the first layer is higher than an oxygen content of the second layer, wherein an incident light passes through the photoelectric conversion layer and is reflected from the rear electrode, wherein the first layer reflects the reflected light back to the second layer, wherein the second layer reabsorbs the reflected light, wherein the first layer is disposed closer to the substrate than the second layer, and the second layer is disposed closer to the photoelectric conversion layer than the first layer, wherein the transparent conductive layer includes a zinc oxide (ZnO)-based material as a basic material; and
wherein the transparent conductive layer further comprises a third layer, wherein an oxygen content of the third layer is lower than the oxygen content of the first layer and higher than the oxygen content of the second layer, and wherein the oxygen content of the third layer decreases gradiently from the first layer to the second layer.

7. The solar cell according to claim 6, wherein a conductivity of the second layer is higher than a conductivity of the first layer.

8. The solar cell according to claim 6, wherein a surface of the transparent conductive layer is textured.

9. The solar cell according to claim 6, wherein the photoelectric conversion layer is amorphous silicon.

* * * * *